United States Patent [19]

Kosakowski et al.

[11] Patent Number: 5,575,888

[45] Date of Patent: Nov. 19, 1996

[54] SIDEWALL PASSIVATION BY OXIDATION DURING REFRACTORY-METAL PLASMA ETCHING

[75] Inventors: John Kosakowski, Laurel, Md.; William Chu, Poughkeepsie, N.Y.; Kelly W. Foster, Annadale, Va.; Christie R. K. Marrian, Marbury; Martin C. Peckerar, Silver Spring, both of Md.

[73] Assignee: The United States of America as represented by the Secretary of the Navy, Washington, D.C.

[21] Appl. No.: 422,102

[22] Filed: Apr. 14, 1995

[51] Int. Cl.$^6$ .............................. H01L 21/3205
[52] U.S. Cl. ................ 156/651.1; 216/75; 437/228; 156/646.1; 156/643.1
[58] Field of Search .............. 216/75; 156/646.1, 156/643.1, 650.1, 651.1; 437/228

[56] References Cited

U.S. PATENT DOCUMENTS

| | | | |
|---|---|---|---|
| 4,579,623 | 4/1986 | Suzuki et al. | 156/646 |
| 4,985,114 | 1/1991 | Okudaira et al. | 156/646 |
| 5,100,505 | 3/1992 | Cathey | 156/643 |
| 5,167,760 | 12/1992 | Mu et al. | 156/646 |
| 5,336,363 | 8/1994 | Morita | 156/646 |
| 5,354,417 | 10/1994 | Cheung et al. | 156/643 |
| 5,368,686 | 11/1994 | Tatsumi et al. | 156/646 |

FOREIGN PATENT DOCUMENTS 07058105  3/1995  Japan.

OTHER PUBLICATIONS

Chu et al., *Appl. Phys. Lett.* 64(16), 18 Apr. 1994, 2172–2174.
Shirey et al., *SPIE* vol. 2194, 169–177 (1994).
Ruska, Walter E., *Microelectronic Processing—An Introduction to the Manufacture of Printed Circuits*, McGraw–Hill, Inc., 1987, pp. 213–236.

Primary Examiner—R. Bruce Breneman
Assistant Examiner—George Goudreau
Attorney, Agent, or Firm—Thomas E. McDonnell; Barry A. Edelberg

[57] ABSTRACT

Sidewalls in a pattern of a refractory metal on a substrate are passivated during plasma etching by introducing water vapor into the etching chamber. This process obtains nearly vertical sidewalls. In one exemplified embodiment, a pattern of tungsten on a chromium etch step layer was reactive ion etched. In that embodiment, the reactive ion etching was intermittently paused. After each pause, the workpiece was warmed from below about 20° C. to about room temperature. Then, water vapor was introduced into the etching chamber housing the workpiece. After the water vapor was introduced, the workpiece was cooled to below about 20° C. and reactive ion etching was resumed. Alternatively, water vapor can be introduced into the etching chamber continuously during plasma etching.

13 Claims, 2 Drawing Sheets

SIDEWALL PASSIVATION BY OXIDATION DURING REFRACTORY-METAL PLASMA ETCHING

BACKGROUND OF THE INVENTION

1. Field of the Invention

The present invention relate generally to the patterning of refractory metals, and in particular to the reduction of undercutting during the etching of refractory metal patterns.

2. Description of the Background Art

Refractory-metal plasma-etching is commonly used to pattern interconnects for integrated circuits. In particular, reactive-ion-etching (RIE) is used to pattern refractory metals, such as tungsten and tantalum, on masks or x-ray lithography. To meet the demand for critical dimension (CD) control in x-ray lithography, the absorber must be patterned with the minimum possible undercut, i.e., with vertical or essentially vertical sidewalls. As linewidths decrease, this requirement becomes much more stringent. Previous works have shown improvement in linewidth control through the use of polymeric sidewall passivation. In one process, a fluorocarbon gas was introduced in the chamber along with the etch gas. Polymer by-products were believed to be deposited on the sidewalls of the etched metal, thereby passivating it. The mechanisms for this deposition were not well-understood, and it was not known how the fluorocarbon gas affected the etch rate of the metal.

SUMMARY OF THE INVENTION

Accordingly, it is an object of this invention to form refractory metal patterns having sidewalls essentially vertical sidewalls.

It is another object of the present invention to minimize undercutting during RIE of refractory metals.

It is a further object of the present invention to refractory metal patterns of extremely narrow linewidth and near-vertical sidewalls.

These and additional objects of the invention are accomplished by exposing the refractory metal to water vapor during plasma etching.

BRIEF DESCRIPTION OF THE DRAWINGS

A more complete appreciation of the invention will be readily obtained by reference to the following Description of the Preferred Embodiments and the accompanying drawings in which like numerals in different figures represent the same structures or elements, wherein.

DESCRIPTION OF THE PREFERRED EMBODIMENTS

Figure 1:
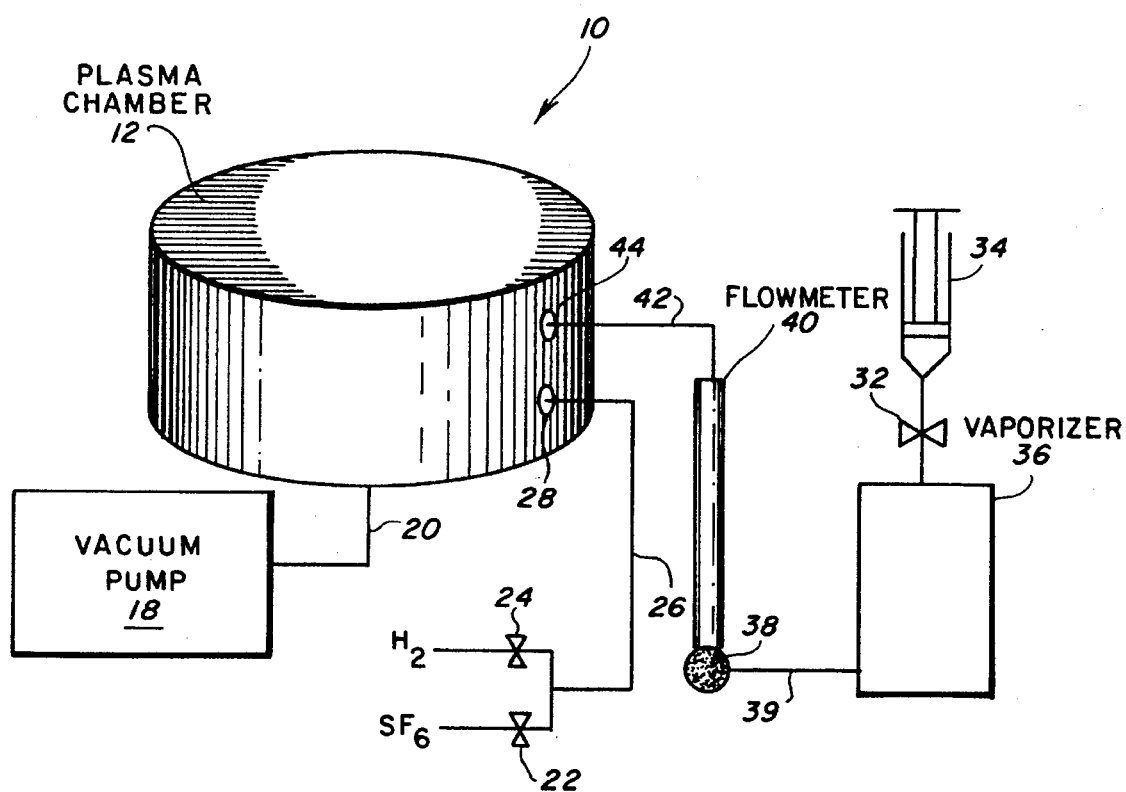
FIG. 1 is a schematic illustration of an apparatus for performing the method of the present invention.

The present invention is useful in controlling undercutting of vertical sidewalls of refractory metals during plasma etching. Any plasma etching method may be used with the method of the present invention. Typically, the method of the present invention is performed using a reactive ion etch.

The workpiece upon which the present invention is performed may be any workpiece suitable for plasma etching of a pattern in a refractory metal layer thereof. Typically, the workpiece includes a substrate, a layer of refractory metal on the substrate, and an etch mask for plasma etching over the refractory metal layer. Optionally, an etch stop layer may be positioned between the substrate and the refractory metal layer. The etch stop layer prevents damage to the substrate that might otherwise result from overetching of the refractory metal layer. While the etch stop layer may be any material that is resistant to the plasma etch and compatible with the layers adjoining it, the etch stop is typically made from the same material as is the etch mask. The preferred etch stop selected will depend, in a known manner, on the etching conditions, and in particular, on the selection of etchant gases and the refractory metal being etched. For example, Cr provides an excellent etch stop for the reactive ion etching of tungsten using a plasma formed from $SF_6$ with $H_2$ added as a diluent gas.

The etch stop layer is also preferably selected to permit endpoint detection. Typical means for endpoint detection include the thin film interference method (H. H. Busta et al., *SPIE Optical Characterization Techniques for Semiconductor Technology*, 276, 164 (1981), the entirety of which is incorporated herein by reference for all purposes), and monitoring the intensity of normal-angle reflection from the substrate, as reported, for example, in Chu et al., *Appl. Phys. Lett.*, 64(16), 18 Apr. 1994, pages 2172–2174 (the entirety of which is incorporated herein by reference for all purposes).

The refractory metal layer is typically a valve metal, such as tungsten, titanium, molybdenum, hafnium, niobium, iridium, and mixtures (such as alloys) thereof. These valve metals typically form a protective oxide when exposed to oxygen or water vapor. Because the refractory metal layer is commonly used as a mask for x-ray lithography, the refractory metal layer will typically be an x-ray absorber and a heavy metal. Those skilled in the art have found tungsten to be an excellent mask for x-ray lithography.

Any plasma of a fluorinated organic or inorganic etchant may be used for etching the refractory metal layer. Typical etchants from which plasma for etching may be formed include $CBrF_3$, $C_2F_6$, $CHF_3$, $CF_4$, $SF_6$, $SiF_6$ and $NF_3$. To prevent overetching, it may also be desirable to add a diluent gas, such as $H_2$ or He, to the etchant before ionization.

During plasma etching, portions of the refractory metal that form the desired pattern must be protected by an etch mask. Any etch mask material useful for plasma etching and compatible with the refractory metal may be used. As stated above, the etch stop layer will typically be the same material as the etch mask.

Save for the introduction of water vapor, either by atmospheric venting or the direct injection of water vapor, the etching conditions used according to the present invention are those typically used for plasma etching. Typical steps for plasma etching are set forth below:

(1) The workpiece is introduced into a etching chamber.

(2) Then, the pressure within the etching chamber is then reduced to essentially vacuum conditions, i.e., a pressure that is sufficiently low to maintain the ionized state of a plasma introduced into the chamber.

(3) The etchant gas is introduced into the vacuum chamber and is then ionized immediately upon or just before its entry into the vacuum chamber.

(4) A plasma of the etchant gases is formed by any means useful for forming plasma, for example, application of a radio frequency electric field.

Additionally, it may be desirable to cool the workpiece during the etching process.

The introduction of water vapor into the etching chamber passivates the nascent sidewalls of the refractory metal that form during plasma etching. Water vapor may be introduced into the etching chamber by any means. Typically, the water vapor is introduced into the chamber by intermittently stopping the plasma etch process, warming (typically to about room temperature) the workpiece (if it was cooled during etching) to prevent the formation of ice crystals and perhaps promote the reactivity of the water with the refractory metal sidewalls, and then venting the reaction chamber to the ambient atmosphere or directly introducing water vapor into the etching chamber. After sufficient water vapor has been added to passivate at least the nascent refractory metal sidewalls, the etching chamber is again evacuated to the pressure required for plasma etching, the substrate again cooled if desired, and plasma etching is resumed.

Obviously, the effects of intermittently introducing water vapor into the chamber will vary depending upon how often, and how regularly, the etching process is interrupted. In the intervals between the introduction of water vapor are too long, then significant undercutting may result before the water vapor passivates the sidewalls. If the intervals between the introduction of water vapor are too short, the benefits of any improved results may be outweighed by the additional processing time. The proper balance between these intervals will depend on the materials selected and the results desired, and may be found empirically, with routine experimentation, based upon the information provided in the present specification.

Alternatively, water vapor can be introduced continually into the etching chamber. Even if the workpiece is maintained at temperatures below freezing during plasma etching, the energy of the plasma should prevent the absorption of water vapor by the horizontal substrate surface.

Regardless of whether the water vapor is introduced into the reaction chamber continuously or intermittently, at least sufficient water vapor to form at least one monolayer of molecular water on the sidewall surfaces should be introduced over the course of the etching process. More typically, sufficient water vapor to form at least one thousand monolayers of water on the sidewalls is introduced into the etching chamber over the course of plasma etching. If too little water is introduced into the chamber, insignificant sidewall passivation results.

The degree to which the addition of water vapor reduces undercutting eventually plateaus as the amount of water vapor is increased. While the introduction of more than the required amount of water is not usually harmful, it is wasteful. However, the use of a great excess of water vapor may form micromasks on the horizontal surface of the substrate. These micromasks may hamper etching of the horizontal surface. However, the amount of water vapor that results in the formation of these micromasks will be significantly larger than the amount of water vapor at which the passivation effect plateaus. Thus, the amount of water vapor introduced into the chamber by be empirically optimized, by routine experimentation.

As explained in Ruska, W. Scot, *Microelectronics Processing*-An Introduction to the Manufacture of Integrated Circuits, McGraw-Hill Book Company, New York, 1987, pages 613 through 235 (the entirety of which is incorporated herein by reference for all purposes), several controllable variables, such as choice of reactants, gas pressure, rf power, gas flow rates and design geometry, affect the plasma etching process. Because of the complexity of interactions among these variables, the optimization of plasma etching is highly empirical. Nevertheless, by considering the details provided in the present specification, perhaps with some additional but routine experimentation, a person skilled in the art to optimize the process of the present invention to suit his or her needs.

After plasma etching, the Cr mask may be retained or removed. If it is desired to remove the Cr mask, it may be etched using standard etching procedures.

Figure 2:
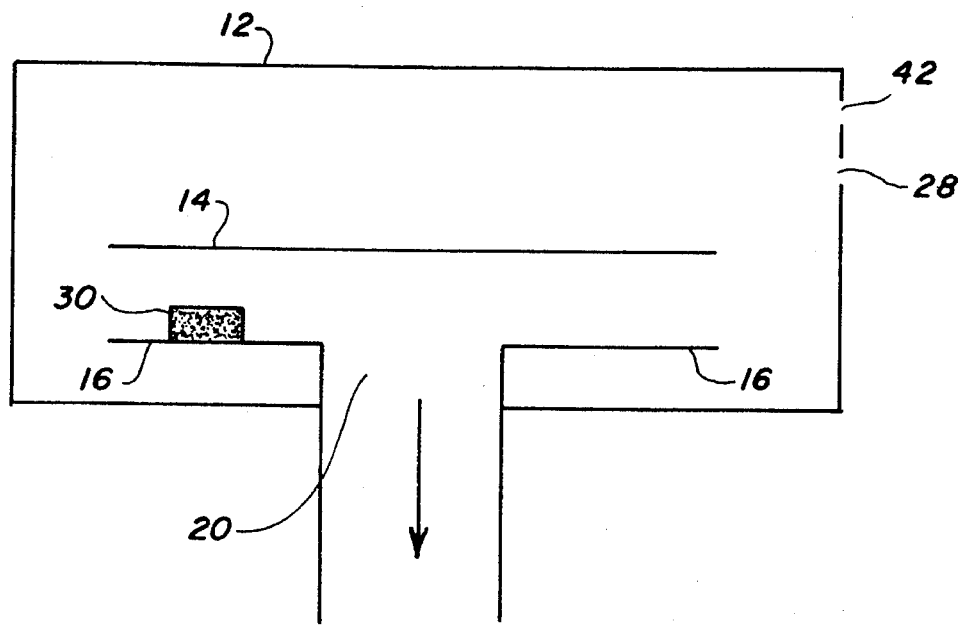
FIG. 2 is a schematic cross-sectional view of the plasma chamber of the apparatus of FIG. 1.

FIG. 1 and FIG. 2 show a typical apparatus 10 for carrying out the present invention. Plasma chamber 12 includes upper electrode 14 and lower electrode 16. Vacuum pump 18 evacuates plasma chamber 12 by drawing gases through outlet 20, in the direction of the arrow in FIG. 2. An rf generator (not shown), when switched on, forms an rf field between upper electrode 14 and lower electrode 16. Valves 22 and 24 control the flow of the etchant gas mixture (in this case $SF_6$ and $H_2$) into supply line 26. The etchant gas mixture flows from supply line 26, through inlet 28, into plasma chamber 12.

The rf field between upper electrode 14 and lower electrode 14 ionizes the gases supplied through inlet 28. Thus, workpiece 30, resting on lower electrode 16, is exposed to a plasma of the etchant gas mixture.

Needle valve 32 controls the flow of water from water syringe 34 into water vaporizer 36. Then ball valve 38 adjusts the flow rate of water vapor from vaporizer 36, through line 39, into flowmeter 40, through line 42, and into plasma chamber 12 via inlet 44. Flowmeter 40 thus monitors the amount of water vapor introduced into plasma chamber 12.

Having described the invention, the following examples are given to illustrate specific applications of the invention including the best mode now known to perform the invention. These specific examples are not intended to limit the scope of the invention described in this application.

EXAMPLES

The workpieces used in these examples consisted of 650 nm thick W on a 10 nm thick Cr etch stop layer on Si wafers. The W films were supper-deposited using low-stress deposition conditions. After cleaning the workpieces using oxygen plasma, a 140 nm thick layer of 950K molecular weight polymethyl methacrylate (PMMA was spun onto the samples, which were subsequently baked at 180° C. for 1 h. The resist was patterned with a JEOL JBX-5D11 scanning-electron-beam lithography system operated at 50 keV accelerating energy, 50 pA beam current (corresponding to a 15 nm Gaussian beam diameter), and 80 µm by 80 µm field size. The patterns written consisted of dots and gratings with linewidths from 5 µm down to 0.1 µm. The dose varied from 2 to 40 nC/cm for lines and 300–500 µC/cm² for dots.

After e-beam exposure, the PMMA was developed by immersion in a solution of 1:2 methyl isobutyl ketone (MIBK):isopropyl alcohol (IPA) at 21.0° C. for 1 min and rinsed in IPA for 30 s. Because of electron backscattering from the high-atomic number tungsten workpiece during exposure, the resulting resist profiles were slightly undercut, making them well-suited for liftoff. The workpieces were descummed using s short oxygen plasma etch and loaded directly into an electron-beam evaporation system where 65 nm of Cr was evaporated. The Cr was lifted off by immersion in acetone with ultrasonic agitation. The Cr was an ideal etch mask for W etching in the mixture of etching gas mixture $SF_6$ and $H_2$, consistent with previous reports of fluorinated gas etching in Jurgenson et al., *J. Vac. Sci.*

Technol. B 9, 3280 (1991), the entirety of which is incorporated herein by reference for all purposes.

The Cr liftoff patterns were then transferred into the W films using a Plasma-Therm 500 series reactive-ion-etching (RIE) system operating at 13.56 MHz. The samples were pumped down to a base pressure of ~5×10$^{-6}$ Torr and the sample electrode cooled to a temperature of −25° C. by a recirculating chiller using a 1:1 ethylene glycol:H$_2$O mixture. The workpieces were etched using a gas mixture of SF$_6$ and H$_2$. The flow rates were 4 sccm for SF$_6$ and 1 sccm for H$_2$.

The chamber pressure was 2 mTorr, which is lower than that usually used in a standard RIE system. The purpose of etching at the low pressure was to achieve greater anisotropy. The bias voltage was −85 V, and the power density was 100 mW/cm$^2$.

Figure 3:
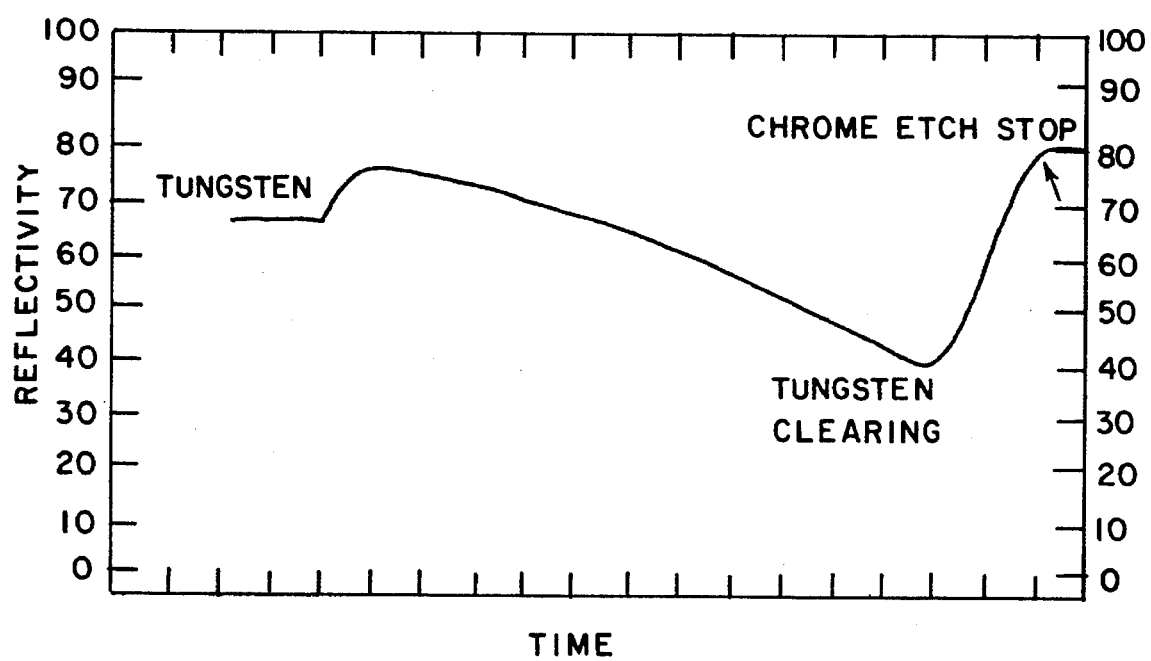
FIG. 3 is a typical trace of the reflectivity from the sample surface taken during an etching run according to the present invention.

To minimize the undercutting during reactive-ion etching, it was important to terminate the etch when the Cr etch-stop layer was reached. For endpoint detection, an existing system for tungsten RIE was adapted. Rather than using the thin-film interference method for dielectric films, the in situ endpoint measurement scheme used simply measured the intensity of normal-angle reflection from the workpiece. A HeNe laser beam was directed through a quartz vacuum window and a small (few mm diameter) aperture in the top, unpowered electrode of the RIE onto the workpiece to be etched. The reflected signal from the metal film on the workpiece was detected. At the wavelength of the HENe laser, 632.8 nm, the normal angle reflection coefficients of Cr and W are 0.64 and 0.51, respectively. As the tungsten was etched away and the Cr etch-stop layer was reached, the reflected signal dramatically increased in intensity and saturated (the Cr was not etched with the gas chemistry used), as shown in FIG. 3. This rise and saturation of the reflected signal was easily used to detect the endpoint of the etch. There is no exact endpoint because the W has not been completely removed at the point of minimum reflectivity. The optimum time that was chosen for terminating an etch run was 2 min past the point of minimum reflectivity. At this point, the grassy W residue should be completely removed from the Cr surface and the amount of overetching kept to a minimum.

The substrates were etched using either of two techniques. Some samples were etched continuously until the termination point, as determined by the endpoint detection system. Others were etched intermittently, with the total run time divided into three shorter etches of equal duration. For the intermittent etches, the sample plate was warmed to room temperature and the vacuum chamber was vented to the atmosphere in between the runs. From scanning electron micrographs (SEMs) of the samples resulting from a continuous 15 min etch for a 100 nm linewidth grating, it could be seen that approximately 80% of the tungsten linewidth had eroded at the thinnest point on the line. This result was compared with micrographs of samples of 100 nm tungsten gratings resulting from three short etches of min duration with a vent to ambient atmosphere in between the etches. The samples made using the intermittent etch process had near vertical sidewalls.

Runs were also performed where the etches were interrupted and the system was not vented to the atmosphere. The samples from these runs had results similar to those of the continuous etch process. This comparison indicated that the suppression of undercut in the intermittent etches is not due to a thermal effect (i.e., cooling of the substrate in between etches), but is due to the action of the ambient atmosphere that occurs when the system is vented to the atmosphere. The action results in passivation and reduces the unintended etching of the sidewalls. This passivation effect allows for the etching of high aspect ratio W patterns (7:1 height-to-linewidth ratio) of sub-100 nm linewidth. In an SEM taken of a three-part etch on a 200 nm linewidth dot array, a slight undercut could be seen at the base of the W posts. The rate of under cutting was observed to increase as the etch reached the Cr etch-stop layer. This lateral etching can be attributed to an increase in the concentration of etch species present after the tungsten was completely consumed. The top two thirds of the W posts showed no undercut because of passivation of the sidewalls after each of the first two etches. Further undercutting was prevented by the immediate termination of the etch upon detection by the endpoint system of the RIE.

In comparison samples, when a flow of 5 sccm SF$_6$ alone was used instead of a mixture of SF$_6$ and H$_2$, extreme linewidth loss resulted. The dilution of the SF$_6$ with 20% H$_2$ slowed the etch rate, but improved selectivity. Dilution of SF$_6$ with CHF$_3$, N$_2$ and He gases did not give results similar to those obtained with H$_2$, although the results obtained using dilution with He were somewhat improved. Sidewall profile obtained by intermittent exposure to O$_2$ or N$_2$ were less vertical than the sidewall profiles obtained by intermittent exposure to air. This result suggested that the water vapor in the ambient air was responsible for the passivation effect observed in the samples intermittently exposed to air.

Obviously, many modifications and variations of the present invention are possible in light of the above teachings. It is therefore to be understood that, within the scope of the appended claims, the invention may be practiced otherwise than as specifically described.

What is claimed is:

1. A method of passivating a refractory metal during plasma etching, comprising the steps of:

providing a workpiece, said workpiece including a substrate having a layer of a refractory metal thereon, said refractory metal being selected from the group consisting of tungsten, titanium, molybdenum, hafnium, niobium, iridium, and mixtures thereof, said layer of refractory metal having, on its outer surface, a patterned etch mask for plasma etching;

plasma etching said refractory metal layer by subjecting said patterned mask and said refractory metal layer to a plasma of a etchant for plasma etching to provide a refractory metal structure having a sidewall;

halting said plasma etching;

passivating said sidewall, while said plasma etching is halted, by exposing said refractory metal structure to an amount of molecular water vapor sufficient to passivate said sidewall;

continuing said plasma etching step after said passivating step.

2. The method of claim 1, wherein said plasma etching step is performed at a temperature below 20° C., and wherein said passivating step is performed at room temperature.

3. The method of claim 1, wherein said refractory metal is tungsten.

4. The method of claim 1, wherein said etchant is fluorinated.

5. The method of claim 4, wherein said fluorinated etchant is selected from the group consisting of SF$_6$, CBrF$_3$, C$_2$F$_6$, CHF$_6$, and CF$_4$.

6. The method of claim 5, wherein said fluorinated etchant is $SF_6$.

7. The method of claim 1, wherein, said plasma is formed from a mixture of said etchant and a diluent gas selected from the group consisting of $H_2$ and He.

8. The method of claim 7, wherein said diluent gas is H2.

9. The method of claim 1, wherein said sidewall absorbs at least one monolayer of water vapor during said passivating step.

10. The method of claim 9, wherein said sidewall absorbs at least one thousand monolayers of water vapor during said passivating step.

11. The method of claim 1, wherein said plasma etching step is peformed by reactive ion etching.

12. The method of claim 1, wherein said exposing of said refractory metal structure to said water vapor causes said refractory metal to react with said water vapor to form a passivated surface on said refractory metal structure.

13. The method of claim 12, further comprising the steps of:

halting said continued plasma etching;

repeating said passivating step after halting said continued plasma etching; and resuming said plasma etching after said passivating step.

* * * * *